United States Patent
Wu et al.

(10) Patent No.: US 10,884,853 B2
(45) Date of Patent: Jan. 5, 2021

(54) FAST SEARCH OF ERROR CORRECTION CODE (ECC) PROTECTED DATA IN A MEMORY

(71) Applicant: Intel Corporation, Santa Clara, CA (US)

(72) Inventors: Wei Wu, Portland, OR (US); Dinesh Somasekhar, Portland, OR (US); Jon Stephan, Hopkinton, MA (US); Aravinda K. Radhakrishnan, Sunnyvale, CA (US); Vivek Kozhikkottu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 16/249,631

(22) Filed: Jan. 16, 2019

(65) Prior Publication Data
US 2019/0146873 A1    May 16, 2019

(51) Int. Cl.
*G06F 11/00* (2006.01)
*G06F 11/10* (2006.01)
*G11C 29/52* (2006.01)

(52) U.S. Cl.
CPC ...... *G06F 11/1068* (2013.01); *G06F 11/1048* (2013.01); *G11C 29/52* (2013.01)

(58) Field of Classification Search
None
See application file for complete search history.

(56) References Cited

U.S. PATENT DOCUMENTS

| 9,148,176 | B2* | 9/2015 | Zhang | H03M 13/2942 |
| 9,940,191 | B2* | 4/2018 | Abali | G06F 11/1004 |
| 2015/0095740 | A1* | 4/2015 | Zampaglione | G06F 11/1068 714/764 |
| 2016/0283316 | A1* | 9/2016 | Abali | H03M 7/00 |
| 2018/0210829 | A1* | 7/2018 | Wickeraad | G06F 16/90339 |
| 2019/0317674 | A1* | 10/2019 | Shoham | G06F 3/0619 |

OTHER PUBLICATIONS

S. C. Krishnan, R. Panigrahy and S. Parthasarathy, "Error-Correcting Codes for Ternary Content Addressable Memories," in IEEE Transactions on Computers, vol. 58, No. 2, pp. 275-279, Feb. 2009, doi: 10.1109/TC.2008.179. (Year: 2008).*

(Continued)

*Primary Examiner* — Daniel F. McMahon
(74) *Attorney, Agent, or Firm* — Schwabe, Williamson & Wyatt, P.C.

(57) ABSTRACT

An apparatus includes a binary content addressable memory (BCAM) to store a plurality of error protection code (ECC) generated codewords (CWs), the BCAM divided into segments (sub-BCAMs), wherein the sub-BCAMs are to respectively store pre-defined first portions of the CWs, and to store corresponding second portions of a search word. In embodiments, the apparatus further includes logic circuitry, to obtain partial match results between the first portions of the CWs and corresponding second portions of the search word, and identify one or more CWs of the plurality of CWs that match the search word, based at least in part on the partial match results, wherein the match indicates that data included in the one or more CW is the same as the data included in the search word.

15 Claims, 8 Drawing Sheets

(56) References Cited

OTHER PUBLICATIONS

Wei Wu et al., "Direct Compare of Information Coded With Error-Correcting Codes," IEEE Transactions on Very Large Scale Integration (VLSI) Systems, Nov. 2012, vol. 20, No. 11, 5 pages.
Kostas Pagiamtzis et al., "A Soft-Error Tolerant Content-Addressable Memory (CAM) Using An Error-Correcting-Match Scheme," IEEE Custom Intergrated Circuits Conference (CICC), (2006), 4 pages.

\* cited by examiner

FAST SEARCH OF ERROR CORRECTION CODE (ECC) PROTECTED DATA IN A MEMORY

FIELD

The present invention relates to search operations on data stored in a computer memory, and in particular to fast searching of error correction code (ECC) protected data in a memory.

BACKGROUND

Memory suffers from both soft and hard errors. To improve data reliability, ECC is often applied to data prior to storing it in a memory. Generally, an ECC takes as an input a data word, and outputs the data word with additional check bits. The check bits may be parity bits generated using a pre-defined algorithm. The original data by itself is often known as a "word." The original word together with the additional check bits are known as a "codeword" (CW), or more specifically, an ECC protected CW. By using the redundant information of the check bits in addition to the original data, the word of a CW stored in memory may be recovered, even if errors have crept into the CW, whether in the original data, the check bits, or both.

However, in order to leverage the benefits of ECC protection, error correction must first be performed on a CW stored in memory to obtain the original word. This is necessary to correct any errors that may have occurred. Thus, if one searches through a memory for a match to an input search word, both the search word and the CWs in memory must be decoded, and then the two data words, respectively output by the error correction algorithm, compared. Without first performing error correction, data with a correctable amount of errors will be counted as a mismatch, which is a false negative. On the other hand, performing error correction to all CWs stored in a memory prior to searching through them is inefficient, and this inefficiency grows with the number of CWs that are searched through. Even if, for efficiency, error correction is only applied to a set of pre-filtered approximate data (e.g., the likely matches as determined by an appropriate algorithm), this may still involve a large amount of processing when the number of stored CWs is very large.

DETAILED DESCRIPTION

Figure 1:
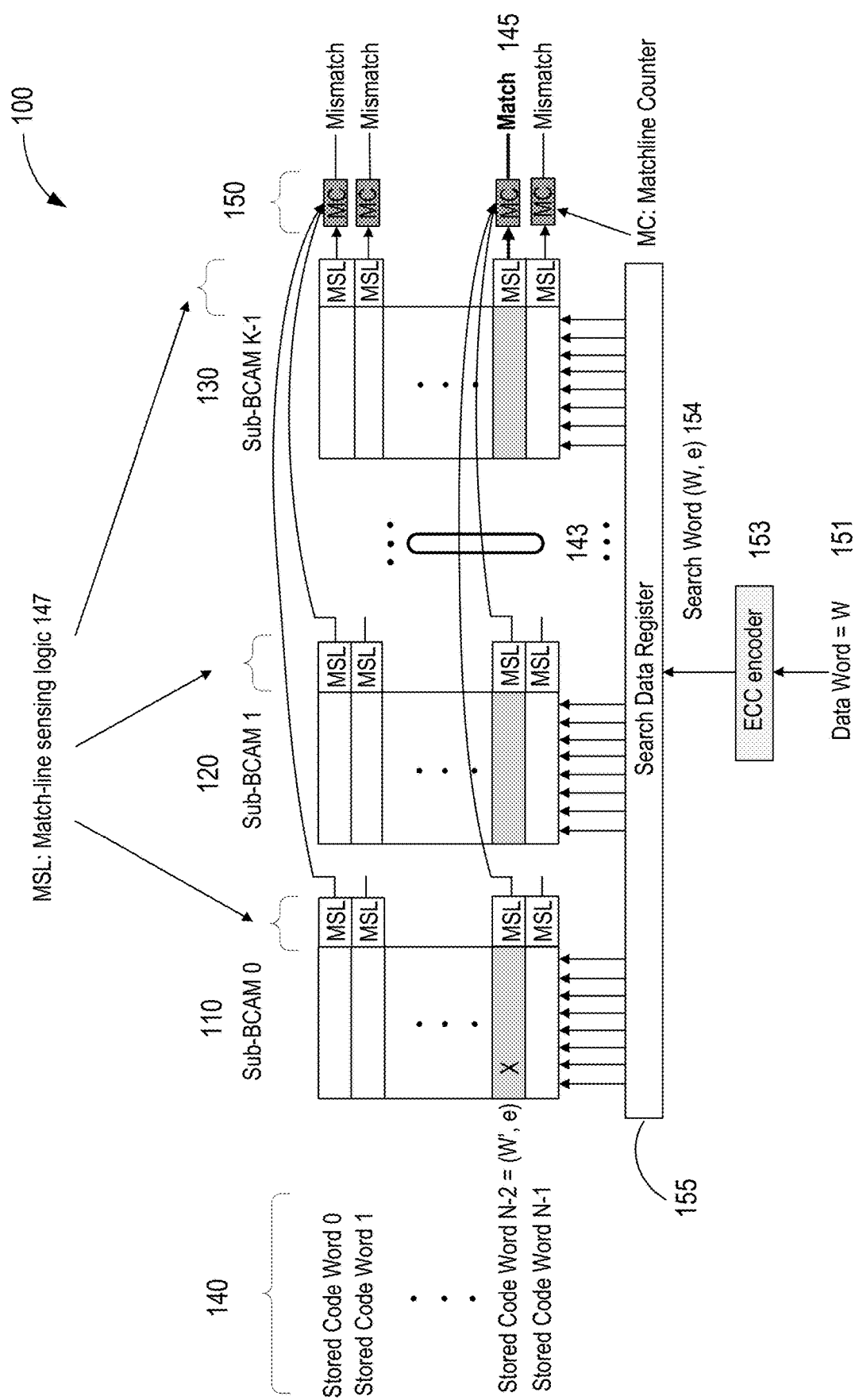
FIG. 1 illustrates an example binary content addressable memory (BCAM), in which several example CWs are stored, in accordance with various embodiments.

In embodiments, an apparatus includes a binary content addressable memory (BCAM) to store a plurality of ECC generated CWs, the BCAM divided into segments (sub-BCAMs), wherein the sub-BCAMs are to respectively store pre-defined first portions of the CWs, and to store corresponding second portions of a search word. In embodiments, the apparatus further includes logic circuitry, to obtain partial match results between the first portions of the CWs and corresponding second portions of the search word, and identify one or more CWs of the plurality of CWs that match the search word, based at least in part on the partial match results, wherein the match indicates that data included in the one or more CW is the same as the data included in the search word.

In embodiments, the logic circuitry includes matchline sensing logic (MSL) to obtain the partial match results at the sub-BCAMs, as well as a matchline counter, coupled to the MSL, to receive the partial match results and add them to obtain a sum. In embodiments, the BCAM is divided into K sub-BCAMs, and if the sum for a CW>=K−1, the CW is identified as a match. Thus, in these embodiments, a single error is tolerated, and thus a single sub-BCAM mismatch is allowed.

In alternate embodiments, it is possible to also tolerate more than one error, i.e., two or more sub-BCAM mismatches, if an appropriate ECC, and a corresponding data division scheme into sub-BCAMs is chosen. This is described in greater detail below.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, including in the claims, the term "chip" may refer to a physical integrated circuit (IC) on a computer. A chip in the context of this document may thus refer to an execution unit that can be single-core or multi-core technology.

As used herein, including in the claims, the term "processor" may refer to a logical execution unit on a physical chip. A multi-core chip may have several cores. As used herein the term "core" may refer to a logical execution unit containing an L1 (lowest level) cache and functional units. Cores are understood as being able to independently execute programs or threads.

As used herein, the term "direct searching" of a memory refers to searching stored CWs, without first decoding them. In embodiments, direct searching may be performed on data that has been processed with an ECC and that has been stored in a BCAM. In embodiments, the ECC code used to generate the CWs may be a single error correct, double error detect ECC, known as "SECDED" code. When using direct searching, some tolerance of errors between a search word and a stored word is necessary, in order to avoid false "mismatches." In embodiments, by carefully choosing a combination of an ECC and a data partition scheme, and thus a corresponding BCAM structure, accurate finding of matches to a search word is facilitated without requiring ECC decoding of the stored CWs prior to the search process. This is enabled by some distance being tolerated between a search word and a matching stored CW.

Various embodiments may be implemented in a memory provided inside a processor or processor core. Alternatively, for example, various embodiments may be provided in near memory computing contexts. Near memory computing provides many benefits, including avoiding having to move data across chip interconnects from memory to processor. Implementing searching operations near memory also exploits greater bandwidth that is available for on-chip memory operations relative to that available for searching off-chip. Many data-centric applications that run on memory need to perform operations such as, for example, filter and data recognition. These operations often involve large amounts of data that need to be processed.

In general, memory that supports a search operation is sometimes known as a content addressable memory (CAM). A CAM is a special type of computer memory used in certain very-high-speed searching applications. In general, a CAM compares input search data against a table of stored data, and returns the address of matching data. In what follows, such a CAM may be referred to as a BCAM, because it stores data in binary bits. For example, in accordance with various embodiments, the BCAM may be an Intel® Granite Rapids BCAM. Thus, in some embodiments, the BCAM may be provided on, or as a part of, a central processing unit (CPU). In other embodiments, it may be implemented in various computing near memory scenarios.

Certain prior approaches supported fast compare functionality for an ECC protected tag. In this approach, the Hamming distance between a requested tag and all stored tags is calculated. If the Hamming distance is less than or equal to the maximum number of correctable errors, then there is a hit. However, this approach requires an accumulator circuit to count the total number of 1's, i.e., the Hamming distance. If a tag has, for example, 22 bits, then a 22-bit accumulator is required. For a CAM with thousands, or even millions, of entries, this approach is cost-prohibitive.

The traditional BCAM is a structure that, given a search data input, outputs an explicit match/mismatch result for every entry. BCAM circuits have been well-designed to reduce area, power and latency overhead. In accordance with various embodiments, a BCAM structure is modified in two significant ways. First, the BCAM is divided into multiple sub-BCAMs, and a final match or mismatch of a stored CW is based on evaluating the combination of all of the sub-BCAM results. Additionally, the ECC used to protect the data stored in the BCAM is carefully designed, such that any data stored in the BCAM that should be a match to the input data may tolerate a threshold of one or more sub-BCAM mismatch results, but any stored data that has sub-BCAM mismatches above the threshold is determined to be a mismatch. In this way a matching CW with an error is still properly identified as a match to an input search word, thereby obviating the need for ECC decoding of stored CWs.

Prior to describing the example BCAM of FIG. 1, some background on conventional BCAM searching is provided. In a conventional data search in memory, a search word is sent to all of the words stored in the memory. In response, for each memory entry, the BCAM outputs one bit, indicating either "match" or "mismatch." This test is performed by, for example, match-line sensing logic. For a "match" bit, the address of the matching entry is obtained, and the stored word accessed.

In a memory in which ECC protected data words are stored, the memory stores both data bits and ECC check bits, together referred to as a CW, as noted above. A false negative, where the stored CW actually does match the search word but is tagged as a mismatch, may occur when an error has occurred in the stored CW. A possible way to cure this problem is to perform error correction on all stored CWs prior to any searching, which removes the errors and facilitates an exact match. However, this requires significant overhead, and is thus inefficient. As noted, another possible remedy is to count the Hamming distance between the search word and each stored CW, so that if the distance between the two is within a correctable range, the erroneous stored CW still returns a match. The difficulty with this approach is that the accumulator logic needed for Hamming distance calculation (generally a group of adders) is non-trivial compared with the standard BCAM match-line sensing logic, which only requires a pull-down path in terms of NAND or NOR gate. This alternative remedy thus adds expense and complicates the BCAM circuitry.

In accordance with various embodiments, basic BCAM array design need not be altered, and standard search and match-line sensing logic may be used. In embodiments, a single BCAM is divided into a set of smaller sub-BCAMs, and each sub-BCAM provides a partial match or mismatch result as to its respective portion of the CW. The individual sub-BCAM results are then consolidated at a matchline counter (MC) to make a final decision as to "match" or "mismatch" for the CW as a whole. An example BCAM divided in this way is shown in FIG. 1, next described.

FIG. 1 illustrates an example binary content addressable memory (BCAM) 100, in which several example CWs are stored, in accordance with various embodiments. BCAM 100 may be provided in a c With reference to FIG. 1, there is shown BCAM 100 divided into K sub-BCAMs 110 through 130. Each sub-BCAM stores a pre-defined portion of each CW, such as, for example, 1/Kth of the total bits in the CW, when K is a factor of the CW bitcount. Or, for example, when a CW cannot be evenly divided into K segments, it is divided in a way that best approximates an even division. It is noted that the total number of bits in a CW is a function of the type of data being stored and the ECC used to encode it.

Continuing with reference to FIG. 1, there are shown sub-BCAM 0 110, sub-BCAM 1 120 and sub-BCAM K–1 130. Sub-BCAMS 2 through K–2, which are provided between sub-BCAM 1 and sub-BCAM K–i are not shown for ease of viewing FIG. 1. As shown at the bottom of FIG. 1, in embodiments, a data word W 151 is received by BCAM 100 from a program or process, such as, for example, a program implementing a search function. The data word is only data, such as, for example, a license number, a medical insurance identification number, an individual's name, an address, or for example, some other key which the program or process wishes to use to search in a database. The database is stored in BCAM 100, for example, and comprises CWs 140 as its entries.

In embodiments, in order to search for the data contained in word 151 in ECC protected BCAM 100, word 151 is also ECC protected, using the same ECC as was used to encode the CWs in BCAM 100, by ECC encoder 153. This generates an encoded version of data word 151, search word 154. Search word (W, e) 154 includes the original data word W, plus additional ECC error correction check bits "e", as shown. Following the encoding process, search word 154 is stored in search data register 155, and a match to it is searched for in BCAM 100. As noted, BCAM 100 has a set of stored CWs 140, each CW stored in one row of the BCAM. Each CW, also being ECC protected by the same ECC used by ECC encoder 153, includes an original data word W' and e ECC check or parity bits, as is shown, for example, for Stored Code Word N–2 145. In embodiments, each CW is divided into several pre-defined portions, according to a chosen data division scheme, as described below. According to that data division scheme, BCAM 100 is divided into sub-BCAMs 110, 120 and on through 130.

Within each of sub-BCAMs 0 through K–1 there is match-line sensing logic (MSL) 147 provided at each row. MSL 147 generates a "match" or "mismatch" bit upon comparing the pre-defined portion of the CW 140 stored in the sub-BCAM with the corresponding pre-defined portion of search word 154. For example, MSL 147 outputs a "1" bit to indicate a match, and a "0" bit to indicate a mismatch. At the end of each row of BCAM 100 is a match counter (MC) 150, which receives each of the partial match bits from the match-line sensing logic of each sub-BCAM in its row over interconnects 143, and sums them. In embodiments, MC 150 is an accumulator. Based on this sum, the overall CW 140 is determined to be a "match" or "mismatch" of search word 154.

For example, as shown in FIG. 1, all of stored CWs 140 are mismatches to search word 154 except for CW 145, stored code word N–2. However, CW 145 is not identical to search word 154, as shown by the "X" in the portion of CW 140 stored in sub-BCAM 0 110, which represents an error that has occurred. Nonetheless, in this example, because the total of "match" bits is K–1, there being only one "mismatch" at sub-BCAM 0 110, matchline counter (MC) 150 for stored code word N–2 145 declares stored code word N–2 145 as a match to search word 154.

In embodiments, MC 150 counts the total number of mismatches and then determines an overall match or mismatch based on Table A below:

TABLE A

|  | Total number of "Mismatch" | Total number of "Match" |
| --- | --- | --- |
| Match | 0 or 1 | K or K–1 |
| Mismatch | 2 or more | K–2 or less |

Table A above presents one example, which is based on a SECDED (single error correct, double error detect) ECC. Thus, a single bit error is relaxed to a single sub-BCAM mismatch, and the ECC code and chosen data division guarantee that no mis-correction occurs.

Similarly, if stronger error correction is used, the greater numbers of errors may be tolerated in alternate embodiments. For example, double error correction DEC ECC codes tolerate a two sub-BCAM mismatch, and triple error correction (TEC) ECC codes tolerate a three sub-BCAM mismatch, and so on. Thus, in general a match may have a greater total number of mismatches and a correspondingly smaller number of matches, and thus, in some alternate embodiments, an even greater number of total sub-BCAM errors may be tolerated, given an appropriate data partition scheme and a corresponding ECC code for that partition scheme. In general, using the framework of Table A, K–i matches are tolerated, where I is an integer. For the examples described above, i=1, 2 or 3.

Thus, in embodiments, BCAM logic includes an array (single or multiple sub BCAMs) and also some control logic. In embodiments, the control logic oversees all the match/mismatch results, and returns an overall match result, which, for example, may be a yes or no answer, or the indexes of all matching entries, or the like.

In embodiments, BCAM 100 is divided so that the number of sub-BCAMs is equal to the number of partitions of the CWs required by the chosen data division scheme and ECC properties. Examples of two data division schemes and ECC properties, and thus corresponding BCAMs, are discussed below in connection with FIGS. 2-4.

In embodiments, the data stored in an example memory is protected by a SECDED code, which is a common type of ECC widely used for data stored in CPU memories as well as in DRAMs. In embodiments, the SEDCED protection is such that there is no false negative for a CW determined to be a mismatch of a search word, and no false positive for a CW found to be a match of a search word. In the example match determination algorithm of Table A, there will be no false negative because any 1-bit error in a stored CW only flips one sub-BCAM's partial match result and thus contributes 1 mismatch, which is still considered to be an overall match.

In embodiments, to guarantee that there is no false positive, a chosen ECC code and data division scheme must guarantee that any two CWs will differ by at least two sub-BCAMs, thus satisfying the criteria of Table A, for example, where one sub-BCAM mismatch result is still a match overall, but two sub-BCAM mismatch results are a mismatch overall. To properly distinguish between a stored CW 140 that actually matches a search word 154, but where an error has occurred, and a another stored CW that is not a match to the search word, a distance of at least two sub-BCAMs may be required between any two CWs, as in the example of Table A.

In this regard it is noted that a conventional SECDED, such as Hamming code or Hsiao code, only guarantees Hamming distance in terms of bits, but not groups of bits, such as a pre-defined portion of a CW stored in a sub-BCAM.

In general, the more sub-BCAMs, the easier it is to avoid false positives. Thus, an extreme case would be where each sub-BCAM has only 1 bit, and then any SECDED code would work. Sub-BCAM mismatch is a relaxed error detection signal. Thus, it does detect error, but it is not known whether there is a 1 bit mismatch or multi-bit mismatch. Accordingly, in embodiments, an ECC code is specially designed with additional constraints on top of conventional SECDED codes.

Figure 2:
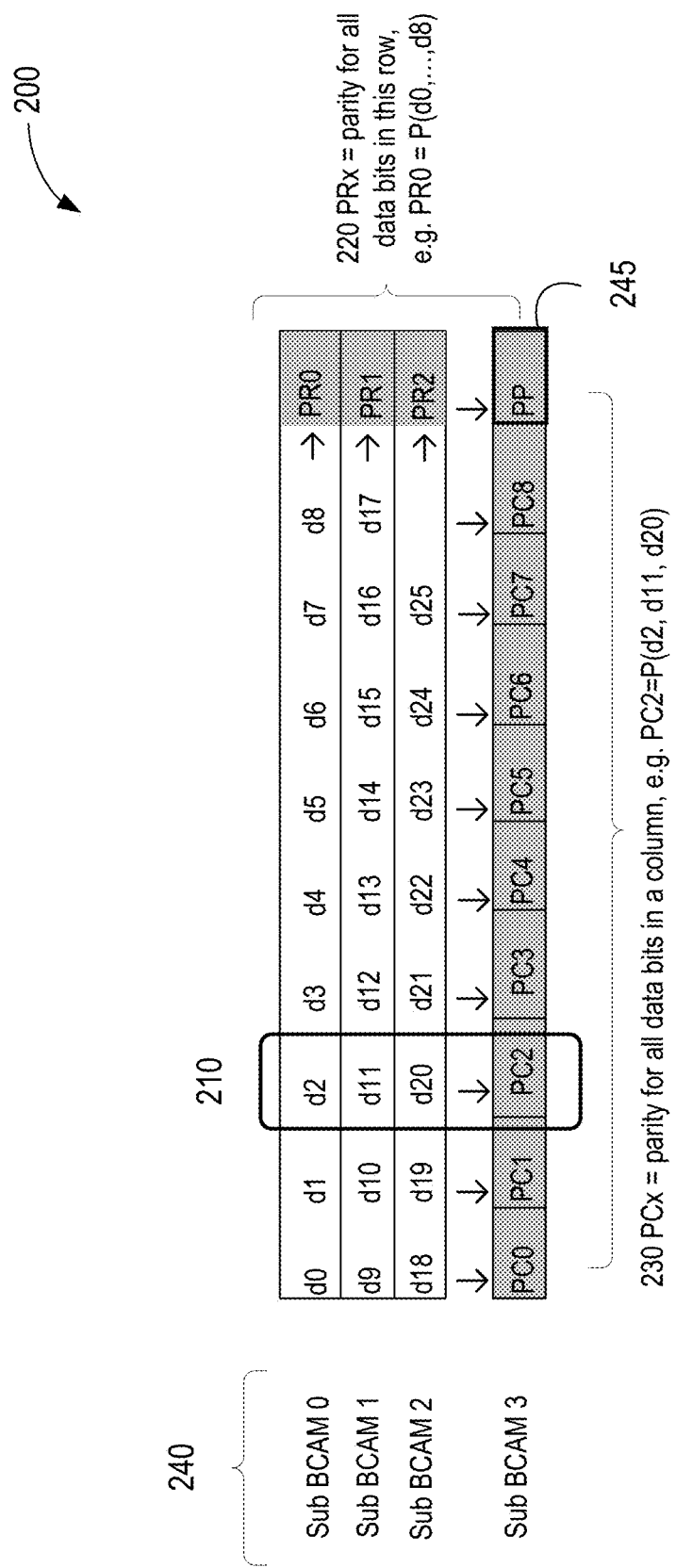
FIG. 2 illustrates an example CW, ECC protected using two-dimensional parity and stored in an example BCAM divided into four sub-BCAMs, in accordance with a first example data division and ECC scheme.
Figure 3:
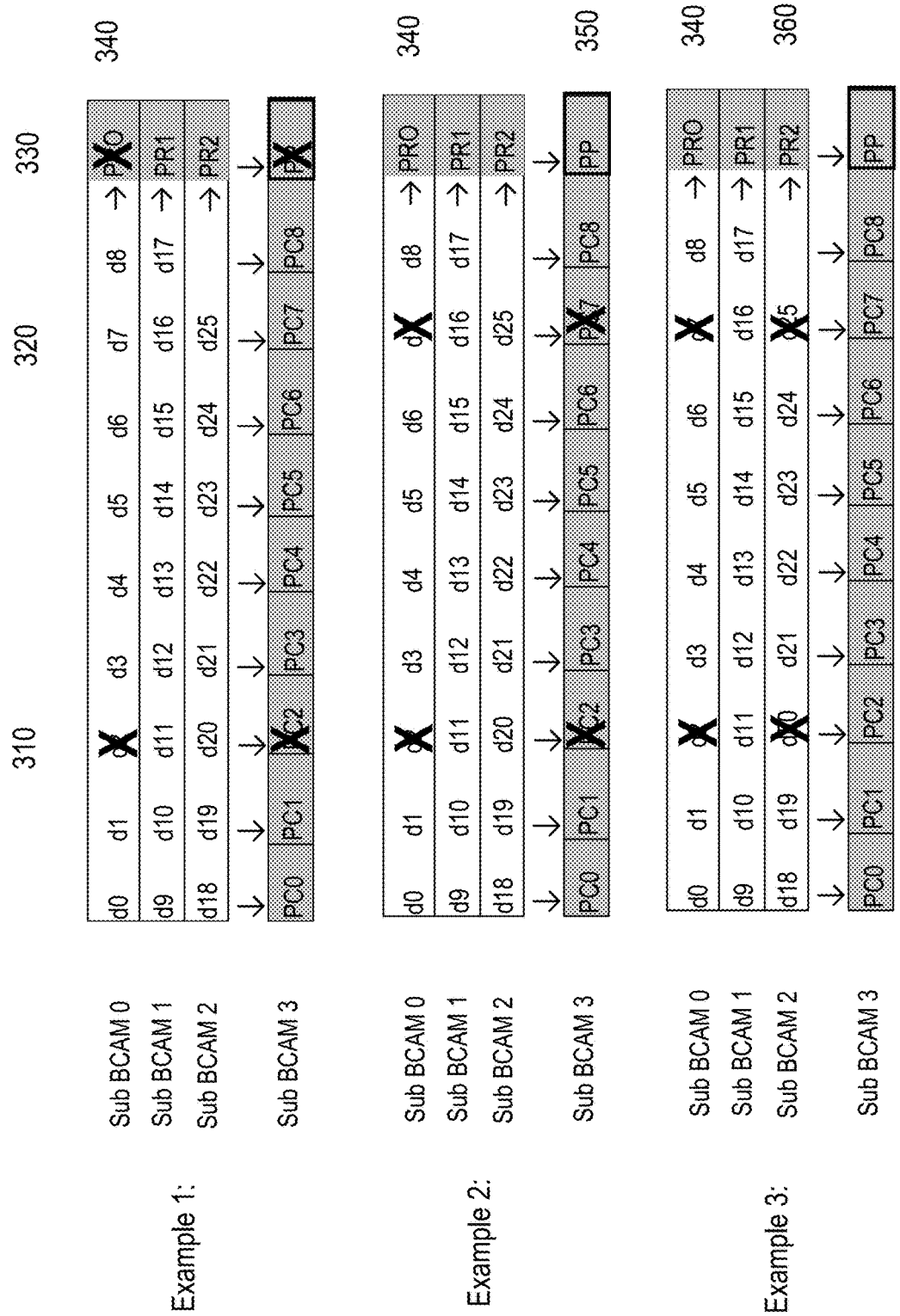
FIG. 3 illustrates three examples of how the ECC two-dimensional parity code ensures a minimum four-bit distance between CWs, in accordance with various embodiments.
Figure 4:
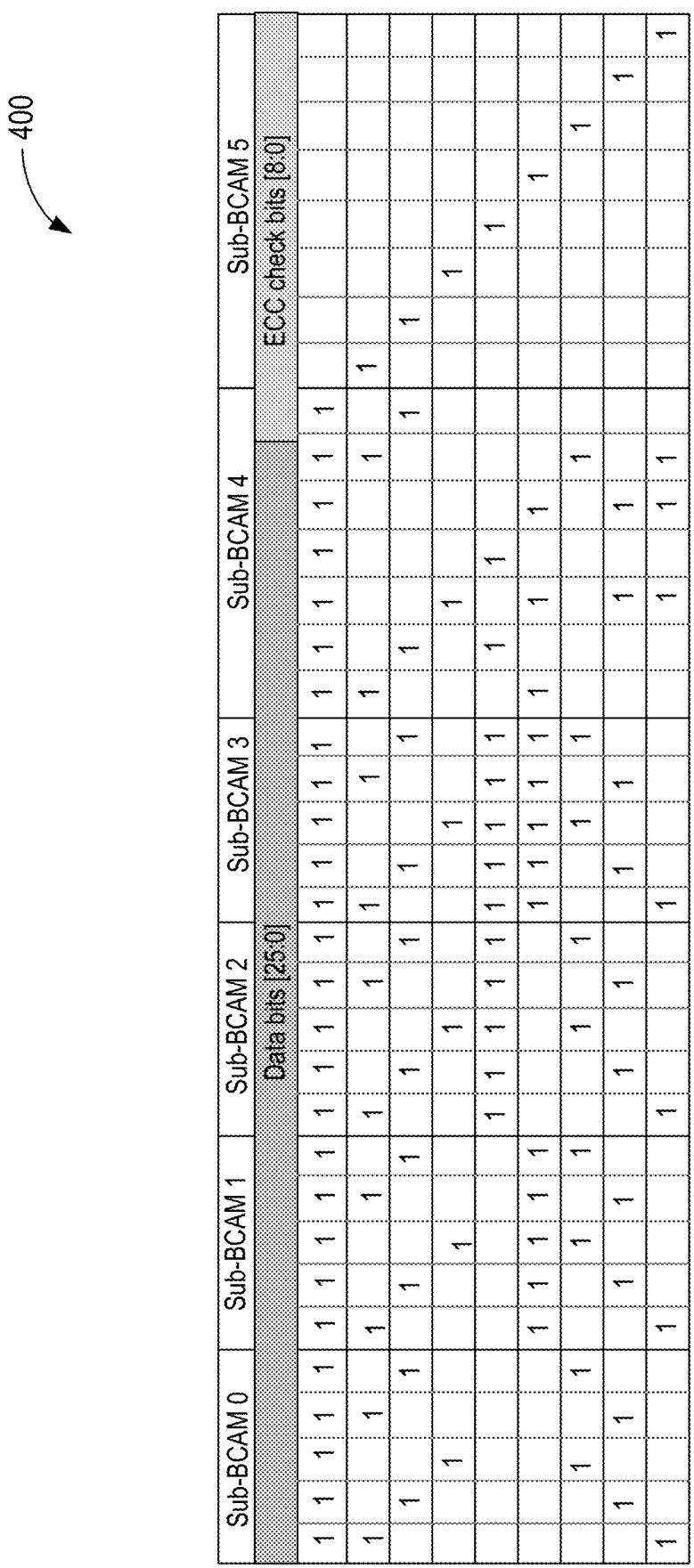
FIG. 4 illustrates an example decoder matrix, used to generate CWs in a second example data division and ECC scheme, in accordance with various embodiments.

In embodiments, two types of ECC coding, with corresponding data partition schemes, may be used to fulfill the criteria of Table A. These are shown in FIGS. 2 through 4. A first example scheme is shown in FIGS. 2-3, and a second example scheme is shown in FIG. 4. The first example scheme, illustrated in FIGS. 2 and 3, is based on two-dimensional parity, and uses an example division of each CW into four portions. The second example scheme, that of FIG. 4, uses a data division scheme and ECC based on a defined decoding matrix (H-matrix). Both example approaches are illustrated using an original data word of 26 bits, but vary in the number of additional ECC check bits generated by applying the respective ECCs to data words, and in how a CW is divided in a BCAM.

FIG. 2 illustrates an example CW, ECC protected using two-dimensional parity and stored in an example BCAM 200 divided into four sub-BCAMs, in accordance with the first example data division and ECC scheme. With reference to FIG. 2, a CW (including data and ECC check bits) is distributed among four sub-BCAMs 240, where each non-final sub-BCAM (sub-BCAMs 0 through 2) may have data and a corresponding ECC check bit, and, in the last sub-BCAM, sub-BCAM 3, it may have only ECC check bits, as follows:

| | |
|---|---|
| Sub BCAM 0: | data bits and ECC check bits |
| Sub BCAM 1: | data bits and ECC check bits |
| ... | |
| Sub BCAM 4: | only ECC check bits |

In embodiments, Thus, the first three sub-BCAMs, sub-BCAMs 0-2, each have a portion of data bits and one parity bit stored in them, and the last sub-BCAM, sub-BCAM 3, has only ECC parity bits stored in it.

The example of FIG. 2 implements two-dimensional parity. Thus, for a CW of 26 data bits, labelled as d0 through d25 in FIG. 2, and 13 additional ECC parity bits, labelled as PC0 through PC8, PP and PR0 through PR2 in FIG. 2, in each of the first two sub-BCAMs 140 there are nine data bits followed by one row-wise parity bit. The row-wise parity bit indicates whether the sum of all "1" bits in the preceding data bits is odd or even. Similarly, in the third sub-BCAM, sub-BCAM 2, there are only eight data bits, d18 through d25, and a row-wise parity bit PR2. There are only eight data bits in Sub-BCAM 2, unlike sub-BCAMs 0 and 1, which each have nine data bits (d0 through d8 in Sub-BCAM 0, and d9 through d17 in Sub-BCAM 1), because 26 data bits cannot be evenly divided into 3. Thus, the final sub-BCAM storing data bits of this CW, sub-BCAM 2, only stores 8 data bits, and the $9^{th}$ bit of sub-BCAM 2 is empty. It may be either a "don't care" bit, or a 0.

Given the two dimensional parity of the ECC code used in the example of FIG. 2, an error that flips one data bit of the CW changes the parity value of both the row and the column in which it is placed, but an error that flips two data bits in either a row or a column does not change the parity of the row or column, as the case may be. As shown in FIG. 2, a PRx value 220 indicates the parity of a row of a CW, and a PCx value 230 indicates the parity of a column of a CW, when the CW is laid out in this two dimensional structure. For example, as shown, the parity of column 210 is PC2, which is the parity of the three data bits d2, d11 and d20 in the third column of the CW. Similarly, because the last bit of each row is a parity bit PRx 220, the column parity of this last row of the CW is "parity parity" (PP) 245, which is the columnar parity of the three row parity bits PR0, PR1 and PR2 of the CW, as shown.

Thus, in the first example data division and ECC scheme, illustrated in FIG. 2:

Data is divided into >=3 subgroups;
  Each subgroup has part of data bits and their corresponding parity, the $1^{st}$ dimension of parity;
  The last subgroup is comprised of the $2^{nd}$ dimension of parity. Each bit in this sub-group covers one bit from previous subgroups; and
  Each subgroup is stored in one sub-BCAM of a row of a BCAM.

FIG. 3 illustrates three examples of how the two-dimensional parity ECC code ensures a minimum four-bit distance between CWs, in accordance with various embodiments. The examples show that a two-dimensional parity code guarantees that any two valid CWs will always have at least 4 bit differences between them after ECC coding, even if the original data words only differ by one or two bits. Thus, if after storage in a BCAM one of the four bits of a CW is in error, given how the CWs are divided amongst the sub-BCAMs, the remaining three bits of CW distance still involve two sub-BCAMs, and thus the erroneous CW, although having a one-bit error, will still be a near match to a search word, in compliance with the criteria of Table A, described above, but not match at all to any other CW. The examples of FIG. 3 show what happens when two data words differ by one, two or four data bits prior to ECC coding. For example, where two user IDs for an online banking application differ by one, two or even four bits, these examples show that the two corresponding CWs obtained after ECC coding will always differ by at least four bits, and thus cannot be a match, even if an error occurs in one of the bits of one of the stored CWs. Thus, if one of them is stored in a BCAM, and the other used as a search word, there will be no false positive match.

In each of the three examples of FIG. 3, a comparison is made between two CWs, representing two original data words, one without any changes, and one with changes to one, two or four bits of the original data word, indicated by the "X"s. Where there is no "X", the second CW is identical to the first, the Xs indicating where the two differ.

In Example 1 of FIG. 3, only one data bit is changed, as shown, data bit d2. After coding with the two-dimensional ECC, an additional three parity bits also change. These include the parity bit of the row 340 in which d2 is provided, PR0, and the parity bit of the column 310 in which d2 is provided, parity bit PC2. Additionally, due to the change in row parity, the column parity of column 330, which comprises the three row parity bits PR0, PR1 and PR2, also changes, and the PP bit is flipped. Thus, after coding using the two-dimensional parity of FIG. 3 (which is the same as used in the example CW of FIG. 2), two original data words that only differ by one bit, actually have a distance of four bits once transformed to CWs.

Example 2 of FIG. 3 shows what happens when a second data bit is changed prior to coding, but where the data bit is sufficiently close to the first changed one, that they are mapped to the same row for ECC coding, and because of this proximity, the row parity is not changed upon ECC coding. In Example 2 the two data words differ in both of data bits d2 and d7. After ECC coding, as shown, the row parity bit PR0 for row 340 does not change, as a two bit change does not change the parity. However, the column parity bit in each of columns 310 and 320, namely column parity bits PC2 and PC7, do change. The final CWs thus differ by four bits, once again.

Similarly, in Example 3 of FIG. 3 another instance of a four bit distance between CWs is shown. Here the distance of four bits between the two CWs is not due to the parity, but because the original data words already differ by four bits, namely d2, d7, d20 and d25. IN a random four bit distance of data words, more than a four bit distance in CWs would normally result. However, in this special case the four bits by which the two data words differ map to a "rectangle" shape, lining up into two rows 340 and 360, and two columns 310 and 320. Because of this row and column commonality, after ECC coding, row parity bits PR0 and PR2 do not change, and column parity bits PC2 and PC7 do not change rather to the original CW. However, there remains a four bit distance between the two CWs.

Given these three examples, it is clear that any two different original data words will always, after coding, result in two respective CWs that differ by at least four bits. In embodiments, this four bit distance guarantee facilitates identifying a match between a stored CW and a search word that only differ in one bit, and thus at one sub-BCAM, as described in Table A. As noted above, in alternate embodiments, where greater numbers of mismatches are tolerated at the sub-BCAM level, the ECC code used may have additional constraints, such as two CWs differing by more than four bits.

In alternate embodiments, a second example ECC and bits partition scheme may be used. In this second example scheme, the ECC check bit overhead is reduced relative to the first example scheme described above. As noted above, in the first example scheme a data word is 26 bits, shown as bits d0 through d25 in FIG. 2, and once encoded has thirteen parity bits: PR0 through PR2, PC0 through PC8 and PP. Thus, in the first scheme the ECC check bit overhead in the first example scheme is at least 2*Sqrt(N), where N is the number of data bits. To reduce this check bit overhead, in embodiments, the second scheme may be used. This second example scheme is illustrated in FIG. 4, next described.

FIG. 4 illustrates an example decoder matrix, used to generate CWs in the second example data division and ECC scheme, in accordance with various embodiments. With reference thereto, layout of an example BCAM implementing this second example scheme is shown. The second scheme also satisfies the two conditions of Table A, described above, to prevent a false positive, but with fewer required ECC check bits.

There are tradeoffs between the two example schemes, however. The lesser number of check bits of the second scheme often requires a larger number of sub-BCAMs, and a slightly larger accumulator for the MCs, as follows.

Scheme 1: 13 check bits, 4 sub-BCAMs (FIGS. 2-3)

Scheme 2: 9 check bits, 6 sub-BCAMs (FIG. 4)

In embodiments, which of the two example schemes provided above are preferred depends on whether fewer sub-BCAMs are preferred, or fewer check bits.

An H-matrix, such as that shown in FIG. 4, is used in coding theory to uniquely define and describe ECC codes. Each column of an H-matrix corresponds to one bit in a CW, and each row of an H-matrix represents a parity equation with selected bits set to '1'. Given that matrix multiplication is involved, if one bit equals 0, then the corresponding column does not contribute to the final result.

In general, a valid CW should have each row-wise parity equal to zero, and also should have $\Sigma H(i)=0$, where i represents bit locations of all bits equal to '1'.

Moreover, an H-matrix for a conventional SECDED code follows three constraints:

Every column H(i) is non-zero, $H(i)!=0$;

Every column is distinct, $H(i)!=H(j)$;

The sum of any two columns does not match to a third column, i.e. $H(i)+H(j)!=H(k)$, where the '+' operator refers to the XOR function.

In embodiments implementing the second example scheme, an H-matrix complies with four additional constraints.

First, to determine the division into sub-BCAMs, the following is performed:

Divide data and $1^{st}$ ECC bits into N−1 Sub-BCAMs, and rest of ECC bits into last sub-BCAM; and Determine the size of each Sub-BCAM to comply with the following constraints:

H-matrix for all ECC bits follows the Identity matrix; and the $1^{st}$ ECC bit covers all data bits.

Second, the following definition is provided:

{ΣSub-BCAM(i)}="The set for all sum of combinations of columns in Sub-BCAM(i)".

For example, Sub-BCAM(0) has 5 columns, so there are a total of $(2^5)-1=31$ combinations of column selections.

Accordingly,

{ΣSub-BCAM(0)} will have 31 elements, and each is a sum of columns, e.g. {H(0), H(0)+H(1), H(0)+H(2), . . . , H(0)+H(1)+H(2)+H(3)+H(4)}.

Constraint 3:

Any two valid CWs, e.g., X and Y, must differ in at least two sub-BCAMs; the parity check based ECC code is a "linear code", and thus the difference between X and Y, |X−Y|, is also a valid codeword. This requirement results in the following:

Any valid CW has at least two sub-BCAMs containing data that are non-zero;

Any data with only one sub-BCAM that is non-zero is not a valid codeword; and

None of the elements in {ΣSub-BCAM(i)} is zero, for any given i.

Constraint 4:

Any CW with a one-bit error still maintains a minimum two sub-BCAM mismatch from any other valid codeword. In embodiments, this translates into:

None of the elements in {ΣSub-BCAM(i)} equals H(k) in Sub-BCAM(j), where i!=j.

The example H-matrix of FIG. 4 satisfies all of these additional constraints. Other example H-matrices which also satisfy them, may, in embodiments, also be used to implement the second example scheme.

In embodiments, in order to prevent error accumulation in the CWs stored in the BCAM, the BCAM is corrected from time to time. In embodiments, two methods may be implemented for this correction. A first method, patrol-scrubbing, which involves periodically checking and correcting all BCAM entries. A second method is implemented whenever a search of the BCAM results in a one sub-BCAM mismatch, where a correctable error (or, in some embodiments, more errors) is detected. Error correction is then performed right away.

Figure 5:
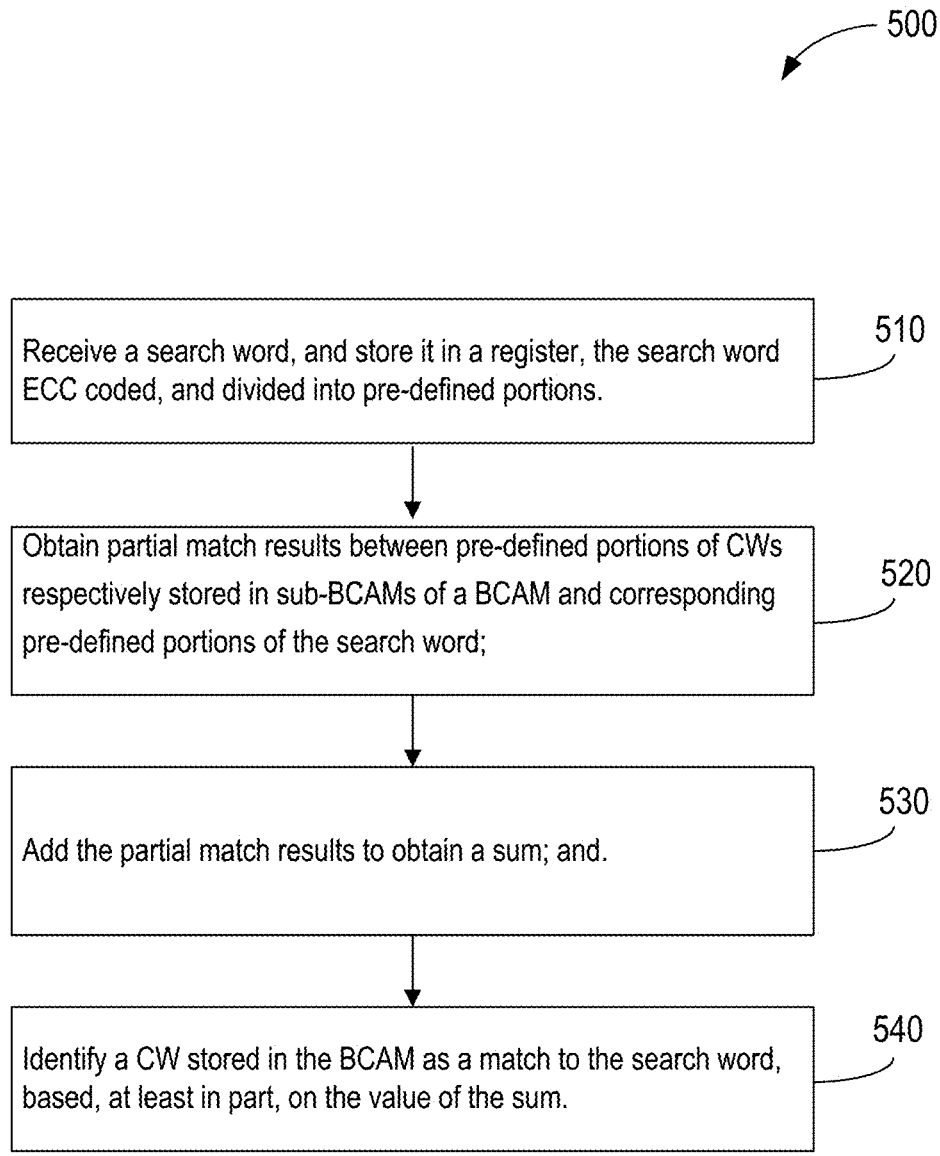
FIG. 5 illustrates an overview of the operational flow of a process for receiving an input codeword and searching for a match amongst a plurality of CWs stored in a BCAM, in accordance with various embodiments.

Referring now to FIG. 5, an overview of the operational flow of a process 500 for receiving an input codeword and searching for a match amongst a plurality of CWs stored in a BCAM segmented into sub-BCAMs, in accordance with various embodiments, is presented. Process 500 may be performed by a CPU or processor, such as processor 702 of FIG. 7, or alternatively near memory processor 725, in accordance with various embodiments. Process 500 may include blocks 510 through 540. In alternate embodiments, process 500 may have more or less operations, and some of the operations may be performed in different order.

With reference to FIG. 5, process 500 begins at block 510, where the CPU or processor receives a search word, the search word encoded by an ECC and divided into pre-defined portions. For example, the search word may be search word 154 of FIG. 1. The CPU or processor causes the search word to be stored in memory, such as, for example, search data register 155 of FIG. 1.

From block 510, process 500 proceeds to block 520, where partial match results are obtained between the pre-defined portions of the search word, and respective corresponding pre-defined portions of each of a set of CWs stored in sub-BCAMs of a BCAM. For example, the CWs may be stored code words 140 of FIG. 1, which are divided into pre-defined portions, respectively stored in sub-BCAMs 110 through 130 as shown in FIG. 1. The pre-defined portions may be according to the first example data division scheme (Scheme 1), illustrated in FIG. 2. The partial match results may be obtained by MSL 147 provided at each of sub-BCAMs 110 through 130, as shown in FIG. 1, and communicated to matchline counters 150, also shown in FIG. 1. For example, a match at a sub-BCAM is represented by a "1" bit output by a MSLunit 147.

From block 520, process 500 moves to block 530, where the partial match results are added to obtain a sum. For example, as shown in FIG. 1, matchline counters 150, receiving the partial match results from the MSL 147 of each associated sub-BCAM (e.g., the ones in their row of the BCAM), add the partial match results together.

From block 530, process 500 moves to block 540, where a CW stored in the BCAM is identified as a match to the search word, based at least in part on the value of the sum. For example, as described above with reference to FIG. 1, a partial mismatch in one sub-BCAM may be tolerated as still being a match, as shown, for example for stored code word N−2 145, which does not match search word 154 in sub-BCAM 0, but does match it in all other sub-BCAMs. Thus, for the example scheme of FIGS. 1 and 2, where a partial match result is indicated by a "1" bit, the required value of the sum, for a K segmented BCAM, is:

$$\text{sum} >= K-1.$$

Figure 6:
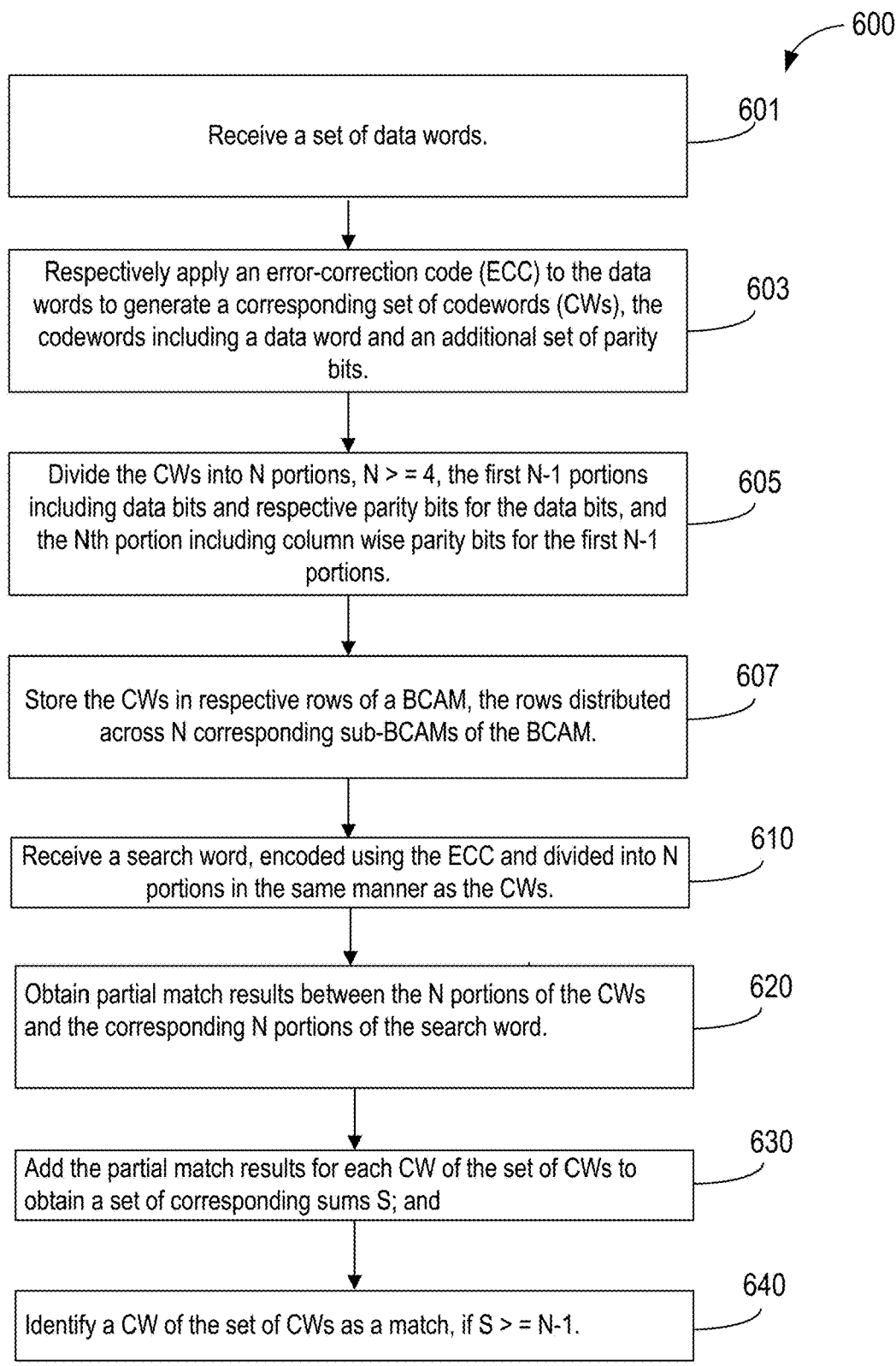
FIG. 6 illustrates an overview of the operational flow of a process for receiving a set of N data words, respectively applying an ECC to the data words to generate a corresponding set of N CWs, and storing the set of CWs in a BCAM segmented into N sub-BCAMs, in accordance with various embodiments.

Referring now to FIG. 6, an overview of the operational flow of a process 600 for receiving a set of data words, applying an ECC to them to generate a corresponding set of CWs, dividing up the CWs according to a corresponding data division scheme, storing them in a segmented BCAM, and searching amongst them for a match to a search word, in accordance with various embodiments, is presented. Process 600 is a more comprehensive version of process 500 of FIG. 5, and illustrates several blocks that occur prior to block 510 of process 500. Blocks 610 through 640 of process 600 are respectively analogous to blocks 510 through 540 of process 500, and thus numbered to reflect that parallelism.

Figure 7:
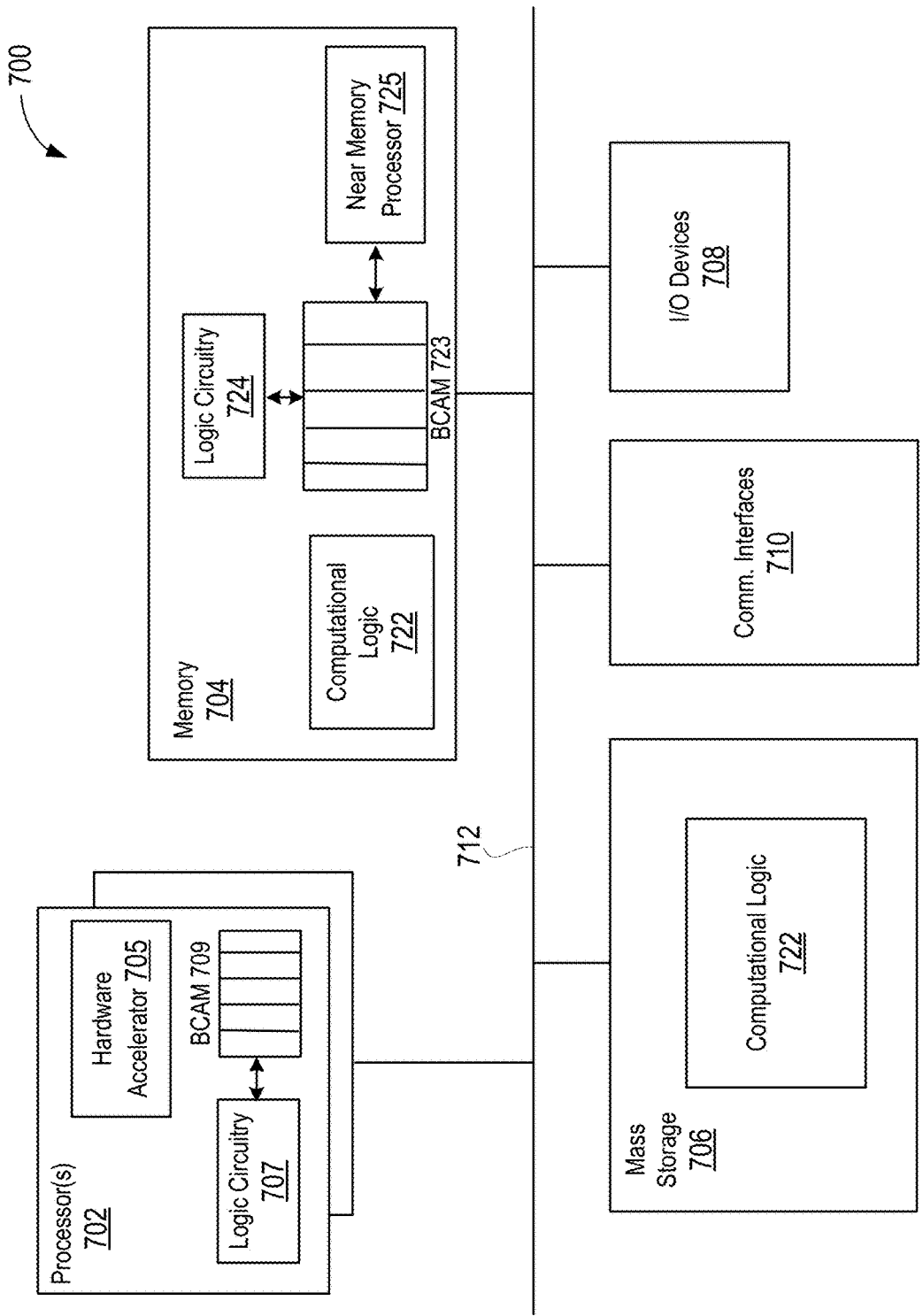
FIG. 7 illustrates a block diagram of a computer device suitable for practicing the present disclosure, in accordance with various embodiments.

Process 600 may be performed by a CPU or processor, such as processor 702 of FIG. 7, or alternatively near memory processor 725, in accordance with various embodiments. Process 600 may include blocks 601 through 640. In alternate embodiments, process 600 may have more or less operations, and some of the operations may be performed in different order.

With reference to FIG. 6, process 600 begins at block 601, where the CPU or processor receives a set of data words. The data words are not protected by any coding at this point. From block 601, process 600 proceeds to block 603, where an ECC code is respectively applied to the set of data words, to generate a set of CWs, where the CWs include the original data word and an additional set of parity bits. For example, as shown in FIGS. 2-3, the data word may have 26 bits, and the CW may include an additional 13 parity bits.

From block 603, process 600 moves to block 605, where the CWs are divided into N portions, N>=4, the first N−1 portions including data bits and respective parity bits for the data bits, and the Nth portion including column wise parity bits for the first N−1 portions. For example, this implements the data division scheme "Scheme 1" described above.

From block 605, process 600 moves to block 607, where the now divided CWs are stored in respective rows of a BCAM, the BCAM segmented into N sub-BCAMs, the N sub-BCAMs corresponding to the N portions into which the CWs are divided, and the rows distributed across the N sub-BCAMs. For example, the divided CWs may be stored code words 140 of FIG. 1, which are stored in K sub-BCAMs 110 through 130 of BCAM 100, as shown in FIG. 1.

From block 607, process 600 moves to block 610, analogous to block 510 of process 500, where the CPU or processor receives a search word, the search word encoded by the same ECC code and divided into N portions in the same manner as the CWs. For example, the search word may be search word 154 of FIG. 1.

From block 610, process 600 moves to block 620, analogous to block 520 of process 500, where partial match results are obtained between the N portions of the CWs and the corresponding N portions of the search word. For example, a match at a sub-BCAM is represented by a "1" bit.

From block 620, process 600 moves to block 630, analogous to block 530 of process 500, where the partial match results of a CW of the set of CWs are added to obtain a sum S. Given that a partial match is represented by a "1" bit, the sum S should be close to, but may be less than, N, depending upon how many partial mismatches are allowed for the chosen data division scheme and the corresponding ECC. For example, in the data division scheme of FIGS. 2 and 3, using a two-dimensional parity ECC, only one partial mismatch is allowed for a matching CW to the search word. In other embodiments, a greater or lesser number of mismatches may be allowed for an overall match.

From block 630, process 600 moves to block 640, analogous to block 540 of process 500, where a CW of the set of CWs is identified as a match, if S>=N−1. If so, the identified CW has the same data word as does the search word.

Referring now to FIG. 7 wherein a block diagram of a computer device suitable for practicing the present disclosure, in accordance with various embodiments, is illustrated. As shown, computer device 700 may include one or more processors 702, and system memory 704. Each processor 702 may include one or more processor cores, and hardware accelerator 705. An example of hardware accelerator 707 may include, but is not limited to, programmed field programmable gate arrays (FPGA). Each processor 702 may also include BCAM 709 and coupled logic circuitry 707, to store CWs and perform searching on the stored CWs as described above.

Computer device 500 may also include system memory 504. In embodiments, system memory 504 may include any known volatile or non-volatile memory. Computer device may also include near memory processor 725, which is coupled to system memory 704 and provided adjacent to it, or, as shown, on the same die with it, so as to avoid moving data across chip interconnects from memory to processor. System memory 704 may also include BCAM 723 and coupled logic circuitry 724, to store CWs and perform searching on the stored CWs as described above, as directed by near memory processor 725.

Additionally, computer device 700 may include mass storage device(s) 706, input/output device interfaces 708 (to interface with various input/output devices, such as, mouse, cursor control, display device (including touch sensitive screen), and so forth) and communication interfaces 710 (such as network interface cards, modems and so forth). In embodiments, communication interfaces 710 may support wired or wireless communication, including near field communication. The elements may be coupled to each other via system bus 712, which may represent one or more buses. In the case of multiple buses, they may be bridged by one or more bus bridges (not shown).

In embodiments, system memory 704 and mass storage device(s) 717 may be employed to store a working copy and a permanent copy of the executable code of the programming instructions of an operating system, one or more applications, and/or various software implemented components of ECC encoder 153, BCAM 100 of FIG. 1, or H-matrix 400 of FIG. 4, collectively referred to as computational logic 722. The programming instructions implementing computational logic 722 may comprise assembler instructions supported by processor(s) 702 or near memory processor 725, or high-level languages, such as, for example, C, that can be compiled into such instructions. In embodiments, some of computing logic may be implemented in hardware accelerator 705. In embodiments, part of computational logic 722, e.g., a portion of the computational logic 722 associated with the runtime environment of the compiler may be implemented in hardware accelerator 705.

The permanent copy of the executable code of the programming instructions or the bit streams for configuring hardware accelerator 705 may be placed into permanent mass storage device(s) 706 and/or hardware accelerator 705 in the factory, or in the field, through, for example, a distribution medium (not shown), such as a compact disc (CD), or through communication interfaces 710 (from a distribution server (not shown)).

The number, capability and/or capacity of these elements 702-725 may vary, depending on the intended use of example computer device 700, e.g., whether example computer device 700 is a smartphone, tablet, ultrabook, a laptop, a server, a set-top box, a game console, a camera, and so forth. The constitutions of these elements 710-725 are either otherwise known or described in detail above, and accordingly will not be further described.

Figure 8:
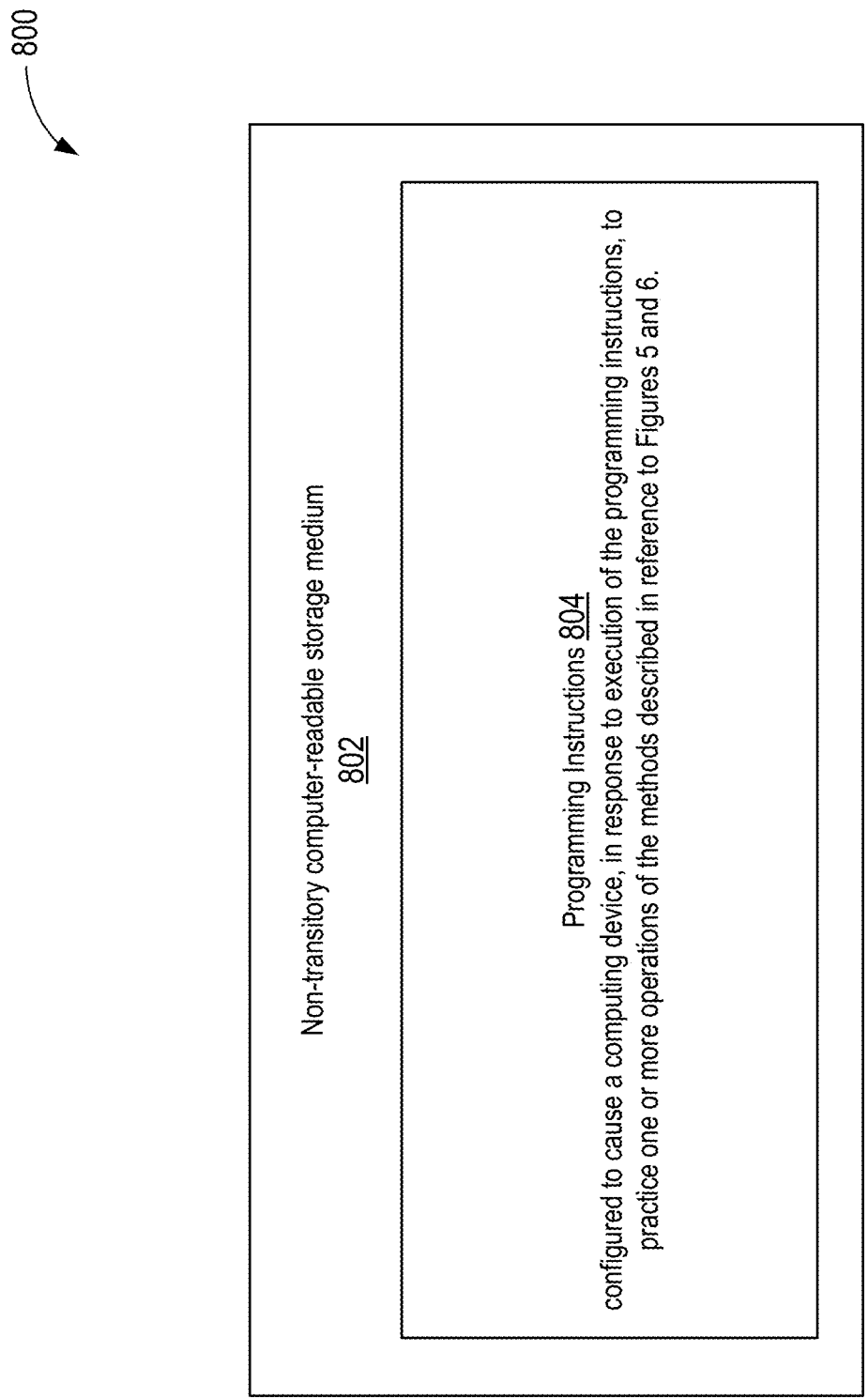
FIG. 8 illustrates an example computer-readable storage medium having instructions configured to practice aspects of the process of FIG. 5, in accordance with various embodiments.

FIG. 8 illustrates an example computer-readable storage medium having instructions configured to implement all (or portion of) software implementations of ECC encoder 153, BCAM 100 of FIG. 1, or H-matrix 400 of FIG. 4, and/or practice (aspects of) processes 500 of FIG. 5 and 600 of FIG. 6, earlier described, in accordance with various embodiments. As illustrated, computer-readable storage medium 802 may include the executable code of a number of programming instructions or bit streams 804. Executable code of programming instructions (or bit streams) 804 may be configured to enable a device, e.g., computer device 700, in response to execution of the executable code/programming instructions (or operation of an encoded hardware accelerator 705), to perform (aspects of) processes performed by ECC encoder 153, BCAM 100 of FIG. 1, or H-matrix 400 of FIG. 4, and/or practice (aspects of) processes 500 of FIG. 5 and 600 of FIG. 6. In alternate embodiments, executable code/programming instructions/bit streams 804 may be disposed on multiple non-transitory computer-readable storage medium 802 instead. In embodiments, computer-readable storage medium 802 may be non-transitory. In still other embodiments, executable code/programming instructions 804 may be encoded in transitory computer readable medium, such as signals.

Referring back to FIG. 7, for one embodiment, at least one of processors 702 may be packaged together with a computer-readable storage medium having some or all of computing logic 722 (in lieu of storing in system memory 704 and/or mass storage device 706) configured to practice all or selected ones of the operations earlier described with reference to FIGS. 5-6. For one embodiment, at least one of processors 702, or near memory processor 725, may be packaged together with a computer-readable storage medium having some or all of computing logic 722 to form a System in Package (SiP). For one embodiment, at least one of processors 702, or near memory processor 725, may be integrated on the same die with a computer-readable storage medium having some or all of computing logic 722. For one embodiment, at least one of processors 702 or near memory processor 725 may be packaged together with a computer-readable storage medium having some or all of computing logic 722 to form a System on Chip (SoC). For at least one embodiment, the SoC may be utilized in, e.g., but not limited to, a hybrid computing tablet/laptop.

Illustrative examples of the technologies disclosed herein are provided below. An embodiment of the technologies may include any one or more, and any combination of, the examples described below.

Examples

Example 1 is an apparatus, comprising a binary content addressable memory (BCAM) to store a plurality of error protection code (ECC) generated codewords (CWs), the BCAM divided into segments (sub-BCAMs), wherein the sub-BCAMs are to respectively store pre-defined first portions of the CWs, and to store corresponding second portions of a search word; and logic circuitry, to obtain partial match results between the first portions of the CWs and corresponding second portions of the search word, and identify one or more CWs of the plurality of CWs that match the search word, based at least in part on the partial match results, wherein the match indicates that data included in the one or more CW is the same as the data included in the search word.

Example 2 is the apparatus of example 1, and/or any other example herein, wherein the logic circuitry includes: match-line sensing logic (MSL) to obtain the partial match results at the sub-BCAMs; and a matchline counter, coupled to the MSL, to receive the partial match results and add them to obtain a sum.

Example 3 is the apparatus of example 1, and/or any other example herein, wherein the BCAM is divided into K sub-BCAMs, and wherein: if the sum for a CW>=K−i, where i is an integer between 1 and 3, the CW is identified as a match.

Example 4 is the apparatus of example 1, and/or any other example herein, wherein the CWs and the search word include an original data word, and check bits generated by the ECC.

Example 5 is the apparatus of example 4, and/or any other example herein, wherein the CWs and the search word include 26 data bits and either 13 or 9 additional check bits.

Example 6 is the apparatus of example 4, and/or any other example herein, wherein an application of the ECC to a CW stored in the BCAM operates to distinguish the CW from other CWs stored in the BCAM by at least four bits.

Example 7 is the apparatus of example 4, and/or any other example herein, wherein an application of the ECC to a CW stored in the BCAM in which a one bit error occurs operates to distinguish the CW from other CWs stored in the BCAM by at least four bits.

Example 8 is the apparatus of example 4, and/or any other example herein, wherein the first portions of a CW stored in the BCAM include: K−1 initial portions, each initial portion including data bits followed by one first dimensional parity bit for the data bits; and one final portion, including second dimensional parity bits for the K−1 portions.

Example 9 is the apparatus of example 8, and/or any other example herein, wherein there are K sub-BCAMs, and wherein the K−1 initial portions are respectively stored in the 1st through (K−1)th sub-BCAMs of the BCAM, and the final portion is stored in the Kth sub-BCAM.

Example 10 is the apparatus of example 1, and/or any other example herein, further comprising a search data register (SDR), and wherein the search word is stored in the SDR while the logic circuitry performs the searches and obtains the partial match results.

Example 11 is the apparatus of example 1, and/or any other example herein, wherein the apparatus is provided within, or is on a same die as a processor of a computing device.

Example 12 is one or more non-transitory computer-readable storage media comprising a set of instructions, which, when executed by a BCAM divided into K sub-BCAMs, the K sub-BCAMS collectively storing a plurality of ECC protected CWs divided according to a data division scheme and distributed across the K sub-BCAMs, cause the BCAM to: receive and store a search word, the search word generated by the ECC from a data word and also divided according to the data division scheme; obtain partial match results between portions of the CWs and respectively corresponding portions of the search word; add the partial match results to obtain a sum S; and based, at least in part, on the value of S, identify a CW as a match to the search word.

Example 13 is the one or more non-transitory computer-readable storage media of example 12, and/or any other example herein, wherein the search word and the CWs include a data portion of pre-defined length and a pre-defined number of check bits generated by the ECC, wherein the ECC is a single error correct, double error detect (SECDED) code, and wherein the ECC is chosen as a function of the data division scheme.

Example 14 is the one or more non-transitory computer-readable storage media of example 13, and/or any other example herein, wherein the ECC code implements two-dimensional parity.

Example 15 is the one or more non-transitory computer-readable storage media of example 13, and/or any other example herein, wherein an application of the ECC to a data word to generate a CW operates to distinguish the CW from other CWs generated by the ECC by at least four bits.

Example 16 is the one or more non-transitory computer-readable storage media of example 13, and/or any other example herein, wherein the data division scheme includes to divide the search word and the CWs into: K−1 initial portions, each initial portion including data bits followed by one first dimensional parity bit for the data bits; and one final portion, including second dimensional parity bits for the K−1 portions.

Example 17 is a method of fast data searching ECC protected CWs in a BCAM segmented into N sub-BCAMs, the CWs divided into N pre-defined first portions, comprising: receiving and storing a search word, the search word divided into N pre-defined second portions; obtaining partial match results between the N first portions of the CWs and corresponding second portions of the search word; identifying one or more CWs as a match of the search word, based, at least in part, on the partial match results, wherein the match indicates that data included in the one or more CW is the same as the data included in the search word.

Example 18 is the method of example 17, further comprising performing error correction on a matching CW to obtain a data word, and outputting the data word to a process or displaying it to a user.

Example 19 is the method of example 17, further comprising: when a partial mismatch is obtained for a first portion of a CW stored in one of the N sub-BCAMs, detecting the error and performing error correction on the portion, and storing the corrected portion in its place.

Example 20 is the method of example 17, performed by a processor disposed on a die with the BCAM, or integrated with the BCAM.

Example 21 is an apparatus for computing coupled to a BCAM segmented into N sub-BCAMs storing ECC protected CWs, the CWs divided into N pre-defined first portions, comprising: means for receiving and storing an ECC protected search word, the search word divided into N pre-defined second portions; means for obtaining partial match results between the N first portions of the CWs and corresponding second portions of the search word; means for identifying one or more CWs as a match of the search word, based, at least in part, on the partial match results, wherein the match indicates that data included in the one or more CW is the same as the data included in the search word.

Example 22 is the apparatus for computing of example 21, further comprising means for performing error correction on a matching CW to obtain a data word, and outputting the data word to a process or displaying it to a user.

Example 23 is the apparatus for computing of example 21, further comprising: means for detecting an error when a partial mismatch is obtained for a first portion of a CW stored in one of the N sub-BCAMs; means for performing error correction on the portion, and means for storing the corrected portion in its place.

Example 24 is the apparatus for computing of example 21, provided on a die with the BCAM, or integrated with the BCAM.

Example 25 is the apparatus for computing of example 21, and/or any other example herein, wherein the BCAM is divided into K sub-BCAMs, and further comprising means for summing to add the partial results, wherein if the sum for a CW>=K−i, where i is an integer between 1 and 3, the means for identifying identifies the CW as a match.

Example 26 is the apparatus for computing of example 21, and/or any other example herein, wherein the stored CWs and the search word include an original data word, and check bits generated by the ECC.

Example 27 is the apparatus for computing of example 26, and/or any other example herein, wherein the stored CWs and the search word include 26 data bits and either 13 or 9 additional check bits.

Example 28 is the apparatus for computing of example 27, and/or any other example herein, wherein an application of the ECC to a CW stored in the BCAM operates to distinguish the CW from other CWs stored in the BCAM by at least four bits.

Example 29 is the apparatus for computing of example 27, and/or any other example herein, wherein an application of the ECC to a CW stored in the BCAM in which a one bit error occurs operates to distinguish the CW from other CWs stored in the BCAM by at least four bits.

What is claimed is:

1. An apparatus, comprising:
a binary content addressable memory (BCAM) to store a first plurality of codewords (CWs), wherein a CW includes a data word and check bits generated by an error correction code (ECC), wherein the BCAM is divided into a second plurality of segments (sub-BCAMs), wherein the BCAM comprises a number of rows that corresponds to the first plurality of CWs, wherein a row is to store the CW, wherein the row is divided into a third plurality of segments corresponding to the second plurality of sub-BCAMs, wherein the CW to be stored in the row is divided into a fourth plurality of portions corresponding to the third plurality of segments, wherein a sub-BCAM is to store a corresponding portion of the CW;
a search data register (SDR) coupled with the BCAM, to store a search word that includes the data word and the check bits generated by the ECC, wherein the search word is divided into a fifth plurality of portions corresponding to the fourth plurality of portions of the CW; and
logic circuitry, to obtain partial match results between the portions of the CWs and corresponding portions of the search word, and identify one or more CWs of the plurality of CWs that match the search word, wherein the match indicates that data included in the one or more CW is the same as the data included in the search word, wherein the logic circuitry includes matchline sensing logic (MSL), wherein the MSL comprises a sixth plurality of MSL components, wherein an MSL component is coupled with a segment of the third plurality of row segments of the row that is to store the CW, wherein the MSL component generates a match or mismatch bit in response to a comparison of a corresponding portion of the CW with a corresponding portion of the search word, wherein the logic circuitry further includes a plurality of match counters, wherein a match counter is coupled with the MSL components in the row of BCAM that is to store the CW, wherein the match counter is to sum the matches and mismatches generated by the MSL components of the row of BCAM, wherein the one or more CWs that match the search word is identified based on the sum generated by the plurality of match counters.

2. The apparatus of claim 1, wherein the logic circuitry includes:
a matchline counter, coupled to the MSL, to receive the partial match results and add them to obtain a sum.

3. The apparatus of claim 2, wherein the second plurality of segments equals K, and wherein:
if the sum for a CW is greater than or equal to K−i, where i is an integer between 1 and 3, the CW is identified as the match.

4. The apparatus of claim 1, wherein the CWs and the search word include 26 data bits and either 13 or 9 additional check bits.

5. The apparatus of claim 1, wherein an application of the ECC to the CW stored in the BCAM operates to distinguish the CW from other CWs stored in the BCAM by at least four bits.

6. The apparatus of claim 1, wherein an application of the ECC to the CW stored in the BCAM in which a one bit error occurs operates to distinguish the CW from other CWs stored in the BCAM by at least four bits.

7. The apparatus of claim 1, wherein the apparatus is provided within, or is on a same die as, a processor of a computing device.

8. One or more non-transitory computer-readable storage media comprising a set of instructions for a processor operating a binary content addressable memory (BCAM), wherein the BCAM comprises a number of rows that corresponds to a first plurality of CWs, wherein a row is to store a CW of the first plurality of the CWs, wherein the CW includes a data word and check bits generated by an error correction code (ECC), wherein the row is divided into a third plurality of segments corresponding to a second plurality of sub-BCAMs, wherein the CW to be stored in the row is divided into a fourth plurality of portions corresponding to the third plurality of segments, wherein a sub-BCAM is to store a corresponding portion of the CW, wherein the instructions, when executed on the processor, cause the processor to:

receive and store a search word, in a search data register (SDR) coupled with the BCAM, wherein the search word includes the data word and the check bits generated by the ECC, wherein the search word is divided into a fifth plurality of portions corresponding to the fourth plurality of portions of the CW;

generate partial match results between portions of the CWs and corresponding portions of the search word, using matchline sensing logic (MSL), wherein the MSL comprises a sixth plurality of MSL components, wherein an MSL component is coupled with a segment of the third plurality of row segments of the row that is to store the CW, wherein to generate includes to obtain a match or mismatch bit generated by the MSL component in response to a comparison of a corresponding portion of the CW with a corresponding portion of the search word;

add the partial match results to obtain a sum using a plurality of match counters, wherein a match counter is coupled with the MSL components in the row of BCAM that is to store the CW, wherein the sum includes the matches and mismatches generated by the MSL components of the row of BCAM; and identify one or more CWs of the first plurality of CWs as a match to the search word, wherein the match indicates that data included in the one or more CW is the same as the data included in the search word.

9. The one or more non-transitory computer-readable storage media of claim 7, wherein the ECC is a single error correct, double error detect (SECDED) code, and wherein the ECC is chosen as a function of a data division scheme.

10. The one or more non-transitory computer-readable storage media of claim 9, wherein the ECC implements two-dimensional parity.

11. The one or more non-transitory computer-readable storage media of claim 9, wherein an application of the ECC to the data word to generate the CW operates to distinguish the CW from other CWs generated by the ECC by at least four bits.

12. A computer-implemented method of searching codewords (CWs) in a a binary content addressable memory (BCAM), wherein a CW includes a data word and check bits generated by an error correction code (ECC), wherein the BCAM is divided into a second plurality of segments (sub-BCAMs), wherein the BCAM comprises a number of rows that corresponds to a first plurality of CWs, wherein a row is to store the CW, wherein the row is divided into a third plurality of segments corresponding to the second plurality of sub-BCAMs, wherein the CW to be stored in the row is divided into a fourth plurality of portions corresponding to the third plurality of segments, wherein a sub-BCAM is to store a corresponding portion of the CW, wherein the method comprises:

receiving and storing, by a processor, a search word, in a search data register (SDR) coupled with the BCAM, wherein the search word includes the data word and the check bits generated by the ECC, wherein the search word is divided into a fifth plurality of portions corresponding to the fourth plurality of portions of the CW;

generating, by the processor using logic circuitry coupled with the BCAM, partial match results between the portions of the CWs and corresponding portions of the search word, wherein the logic circuitry includes matchline sensing logic (MSL), wherein the MSL comprises a sixth plurality of MSL components, wherein an MSL component is coupled with a segment of the third plurality of row segments of the row that is to store the CW, wherein generating includes obtaining, by the processor, a match or mismatch bit generated by the MSL component in response to a comparison of a corresponding portion of the CW with a corresponding portion of the search word; and identifying, by the processor using the logic circuitry, one or more CWs as a match of the search word, based, at least in part, on the partial match results, wherein the logic circuitry further includes a plurality of match counters, wherein a match counter is coupled with the MSL components in the row of BCAM that is to store the CW, wherein the identifying includes summing, by the processor, the matches and mismatches generated by the MSL components of the row of BCAM, wherein the match indicates that data included in the one or more CW is the same as the data included in the search word.

13. The computer-implemented method of claim 12, further comprising performing, by the processor, error correction on a matching CW to obtain the data word.

14. The computer-implemented method of claim 12, further comprising, when a mismatch is obtained for a portion of the CW stored in one of the sub-BCAMs, detecting, by the processor, the error;

performing, by the processor, error correction on the portion; and storing, by the processor, the corrected portion.

15. The computer-implemented method of claim 12, wherein the processor is disposed on a die with the BCAM, or integrated with the BCAM.

* * * * *